(12) United States Patent
Littlejohn

(10) Patent No.: US 9,989,585 B2
(45) Date of Patent: Jun. 5, 2018

(54) HORIZONTAL INFRASTRUCTURE HANDLING FOR INTEGRATED CIRCUIT DEVICES

(71) Applicant: Silicon Laboratories Inc., Austin, TX (US)

(72) Inventor: Dan Littlejohn, West Lake Hills, TX (US)

(73) Assignee: Silicon Laboratories Inc., Austin, TX (US)

( * ) Notice: Subject to any disclaimer, the term of this patent is extended or adjusted under 35 U.S.C. 154(b) by 284 days.

(21) Appl. No.: 14/837,891

(22) Filed: Aug. 27, 2015

(65) Prior Publication Data

US 2017/0060120 A1    Mar. 2, 2017

(51) Int. Cl.
| | |
|---|---|
| *G06F 11/26* | (2006.01) |
| *G06F 11/27* | (2006.01) |
| *G01R 31/28* | (2006.01) |
| *G06F 11/263* | (2006.01) |
| *G06F 11/273* | (2006.01) |
| *H01L 21/66* | (2006.01) |

(52) U.S. Cl.
CPC ........ *G01R 31/2868* (2013.01); *G06F 11/263* (2013.01); *G06F 11/2733* (2013.01); *G06F 2217/14* (2013.01); *H01L 22/14* (2013.01); *H01L 22/20* (2013.01)

(58) Field of Classification Search
CPC ............... G06F 11/263; G06F 11/2733; G06F 17/5045; G06F 11/2273; G06F 11/267; G06F 2217/14; H01L 2924/14; Y10T 22/49117

USPC ................................ 700/108, 109, 110, 121
See application file for complete search history.

(56) References Cited

U.S. PATENT DOCUMENTS

| | | | |
|---|---|---|---|
| 3,781,683 A | 12/1973 | Freed | |
| 6,817,602 B2 | 11/2004 | Charles et al. | |
| 6,895,294 B2 | 5/2005 | Mautz et al. | |
| 2002/0014465 A1 | 2/2002 | Chung | |
| 2006/0029762 A1 | 2/2006 | Chung | |
| 2008/0103619 A1* | 5/2008 | Beecher | G01R 31/2806 700/109 |
| 2009/0130387 A1 | 5/2009 | Contes et al. | |
| 2010/0201391 A1 | 8/2010 | Gunji et al. | |
| 2012/0117925 A1 | 5/2012 | Itou | |

OTHER PUBLICATIONS

Advantek, Products, Packaging Reels, Printed From Internet Aug. 12, 2015, 1 pg.

(Continued)

*Primary Examiner* — Michael J Brown
(74) *Attorney, Agent, or Firm* — Egan Peterman Enders Huston

(57) ABSTRACT

Systems and methods are provided that may be implemented to produce customized integrated circuit (IC) device parts together from a common base IC device part that is customized with settings or code to build different unique IC device parts for different purposes that are processed and output together from the manufacturing process. Different individual devices of the common base part may be customized (e.g., programmed) with different settings and/or code to build respective uniquely configured parts for different purposes, e.g., such as according to different respective part orders.

21 Claims, 7 Drawing Sheets

(56) References Cited

OTHER PUBLICATIONS

Advantek, Carrier Tape, Printed From Internet Aug. 12, 2015, 1 pg.
Advantek, Products, Embossed Carrier Tapes, Printed From Internet Aug. 12, 2015, 1 pg.
Advantek, Carrier Tapes, 2015, 1 pg.
Advantek, Products, Cover Tapes, Printed From Internet Aug. 12, 2015, 1 pg.

* cited by examiner

US 9,989,585 B2

HORIZONTAL INFRASTRUCTURE HANDLING FOR INTEGRATED CIRCUIT DEVICES

FIELD OF THE INVENTION

This disclosure generally relates to integrated circuit devices and, more particularly, to programming and testing of integrated circuit devices.

BACKGROUND

Part test and programming of horizontal integrated circuit (IC) device products (i.e., customized small lots of integrated circuit parts programmed for different purposes) is very labor intensive and error-prone due to customization per order, low part count per order, and high order count. These customized IC device parts are low quantity high order count products that with conventional manufacturing and programming processes require a large amount of effort by individual human operators for each order. The output IC device parts are individually handled in tape and reel media cut tape also requiring large amount of documentation and effort to handle and ship. The overall manufacturing and programming process for such customized IC devices requires a long list of tasks and process steps. These tasks and process steps include individual part handling per order (physically counting parts), transacting orders in business software packages such as Software Applications Products (SAP), recording order details on lot travelers, setting up a tester and handler and testing/programming the parts, setting up a laser marker and marking parts (if the part is post marked), setting up and scanning parts for defects, and managing the order to shipping.

FIG. 1 illustrates a conventional architecture 100 for part test and programming of custom horizontal integrated circuit (IC) device products from a common type of incoming uncustomized base IC device parts 103. As described below, the test and programming methodology of architecture 100 is performed in its entirety to produce one type of custom IC device part at a time before being repeated again in its entirety to produce another type of custom IC device part. Thus, the methodology of architecture 100 is repeated over and over for different individual IC device part orders. As illustrated, an individual custom IC device part order 111 specifies custom part programming and is provided to bookkeeping and order software (BKO) 102. A human planner 108 interacts with BKO 102 by reading the details of the given single custom IC device part order 111 from BKO 102 and then providing scheduling information to BKO 102 that specifies testing and programming parts for the given individual order 111 as a single lot by itself. A human operator 110 interacts with BKO 102 by reading scheduling information and specified custom programming directly from BKO 102 for the given individual order 111, and then controls programming and testing equipment 104 to custom program IC base parts 103 according to the individual order 111, and to test the programmed parts. Operator 110 reads the programmed part test results from programming and testing equipment 104 and provides the test results to BKO 102. Thus all commonly programmed custom parts of the single given custom order 111 are processed (tested and programmed) by programming and testing 104 under control of human operator 110 in batch fashion as a single lot 120 of commonly programmed custom parts corresponding to custom part order 111 which is then singulated by cut tape and reel media (i.e., as a single cut tape and reel media that contains only the same type of commonly programmed parts specified by the single given custom part order 111) for finished goods inventory (FGI) processing 106. This process is repeated for each different lot 120 singulating each order in cut tape and reel media, requiring the tape cut and packaged into an electrostatic bag after every individual lot 120 is manufactured and taped.

In FGI processing 106, the custom IC device parts of a single lot 120 in the electrostatic bag is handled for the single custom part order 111 into an individual package 122 for shipping under the control of human operator 112 as a single lot of commonly programmed custom parts to an end destination 130 specified by or otherwise corresponding to the given custom IC device part order 111. As shown, human operator 110 interacts with FGI processing 106 by handling cut tape and reel media in an electrostatic bag individual custom IC device parts from single lot 120 for shipping. Thus, the customized IC devices corresponding to the single custom part order 111 are separately processed from any other custom part order and are shipped together as one lot, with each processed and shipped lot of IC devices corresponding to only one custom part order. In this regard, methodology of architecture 100 is repeated over and over for each different custom part order to produce a separately processed lot 120 of custom programmed devices for each different custom part order.

SUMMARY

Disclosed herein are systems and methods that may be implemented to produce customized integrated circuit (IC) device parts together from a common type of uncustomized base IC device part that is customized with settings or code to build different unique IC device parts for different purposes that are processed and output together from the manufacturing process. In one exemplary embodiment, the disclosed systems and methods may be implemented to quickly and reliably produce customized individual parts from a common type of base part using minimized labor as compared to labor required for producing such parts using conventional custom IC manufacturing and programming processes. Different individual devices of the common uncustomized base part may be customized (e.g., programmed) with different settings and/or code to build respective uniquely configured parts for different purposes, e.g., such as for different customers according to different respective part orders. In one embodiment, the disclosed systems and methods may be implemented to manufacturer different uniquely customized parts from a common base part in a manner that reduces manufacturing costs, reduces chance for manufacturing errors, and improves customized part order processing cycle time.

In one exemplary embodiment, the disclosed systems and methods may be implemented by a device manufacturer to collect customization data from an individual part customer (e.g., directly from the customer if desired) and to build customized part lots with minimal human operator interaction. In a further embodiment, customization data may be entered as a transaction in a manufacturing execution system of a device manufacturer. Such customization data may include custom programming information and/or other part customization details such as custom marking information for individual devices of each lot of customized parts (i.e., if required or otherwise desired). Customized parts may also be built using specified quality checks for each different type of customized parts corresponding to a given part order, and the manufactured customized parts of many different part orders may be processed together and output as multiple lots onto a single tape and reel media output reel (e.g., with each lot of different part types being identified by a tape and reel cover tape label with part and lot information). When employed, the output cover tape label may be used to enable reliable identification and shipment of each of the individual lots that have processed and included together on the same output tape media.

The disclosed systems and methods may be implemented in one embodiment as a method to bulk process relatively small custom IC part orders with individual lot identification. In another embodiment, a multi-platform configuration system (e.g., server or computer workstation) may be implemented with a scheduler that aggregates small quantity custom IC part product orders and determines what mother lots of base IC parts may be utilized to process and fulfill them, and with a horizontal infrastructure part customization that is configured to manage customer part customization data from customer to tester.

In another embodiment, a tester cell master may be implemented to provide manufacturing execution system integration to automate order/lot processing transactions and what custom IC part orders may be processed with a given mother lot. A tester cell master may also be implemented in one embodiment to provide tester integration in which cell master automates setting up tester test program and customization data for each custom IC part lot. A tester cell master may also be implemented to achieve handler integration in which the tester cell master orchestrates a part handler and all attached devices (e.g., tester, laser mark, labeler, scan) for processing each custom IC part order without human interaction between orders. A tester cell master may also be implemented in one embodiment to achieve marker integration, e.g., if a given custom IC part requires or otherwise specifies a custom mark, the tester cell master may be configured to automate what custom mark/s is put on a custom IC part/s for each custom order. A tester cell master may also be implemented in one embodiment to control a labeler (e.g., a tape and reel cover tape labeler) such that many custom IC part lots may be manufactured and output onto one outgoing tape and reel with no human interaction such that each of the individual custom IC part lots being individually identified by a label for each custom IC part lot. In this regard, tape and reel media labels may be employed that include custom IC part identifier information that allow for post processing of the individual custom IC part orders for shipment, e.g., each label may include a barcode that may be scanned to lookup end destination information details, (e.g., such as customer delivery address), and the custom IC parts of an individual custom IC part order cut from the outgoing tape reel for shipment according to the destination details.

In one respect, disclosed herein is a system configured to produce customized integrated circuit (IC) device parts from multiple incoming uncustomized base IC parts. The system may include: a test system including one or more test sockets, a handler, and an outgoing tape reel; and at least one processing device configured to communicate with the test system and programmed to control the handler to place each of multiple incoming uncustomized base IC device parts into the test sockets for custom programming to produce multiple custom programmed IC device parts, and then to remove and transfer the multiple custom programmed IC device parts into individual part compartments of a common carrier tape of the outgoing tape reel and cover the custom programmed IC device parts within the individual part compartments with a cover tape over the individual part compartments. Then at least one processing device may be further configured to communicate with the test system and be programmed to: control test socket custom programming of a common type of uncustomized base IC parts in different ways so as to produce respective different types of custom IC device parts specified by different custom IC part orders, and then control positioning the different types of custom IC device parts specified by the different custom IC part orders into separate part compartments defined in the common carrier tape of a single outgoing reel of tape media.

In another respect, disclosed herein is a method of producing customized integrated circuit (IC) device parts from uncustomized base IC parts, including: using at least one processing device to custom program a common type of uncustomized base IC parts in different ways so as to produce respective different types of custom IC device parts specified by different custom IC part orders; and then positioning the different types of custom IC device parts specified by the different custom IC part orders into separate part compartments defined in a common carrier tape of a single reel of tape media.

In another respect, disclosed herein is a reel of tape media including: an elongated tape wound on a tape reel, the elongated tape including multiple separate part compartments defined therein that are configured to contain integrated circuit (IC) device parts; and different types of custom IC device parts positioned in the separate part compartments defined in the same elongated tape wound on the tape reel, the different types of custom IC device parts being differently programmed from a common type of uncustomized base IC part according to the specifications of respective different custom IC part orders.

DESCRIPTION OF ILLUSTRATIVE EMBODIMENTS

Figure 1:
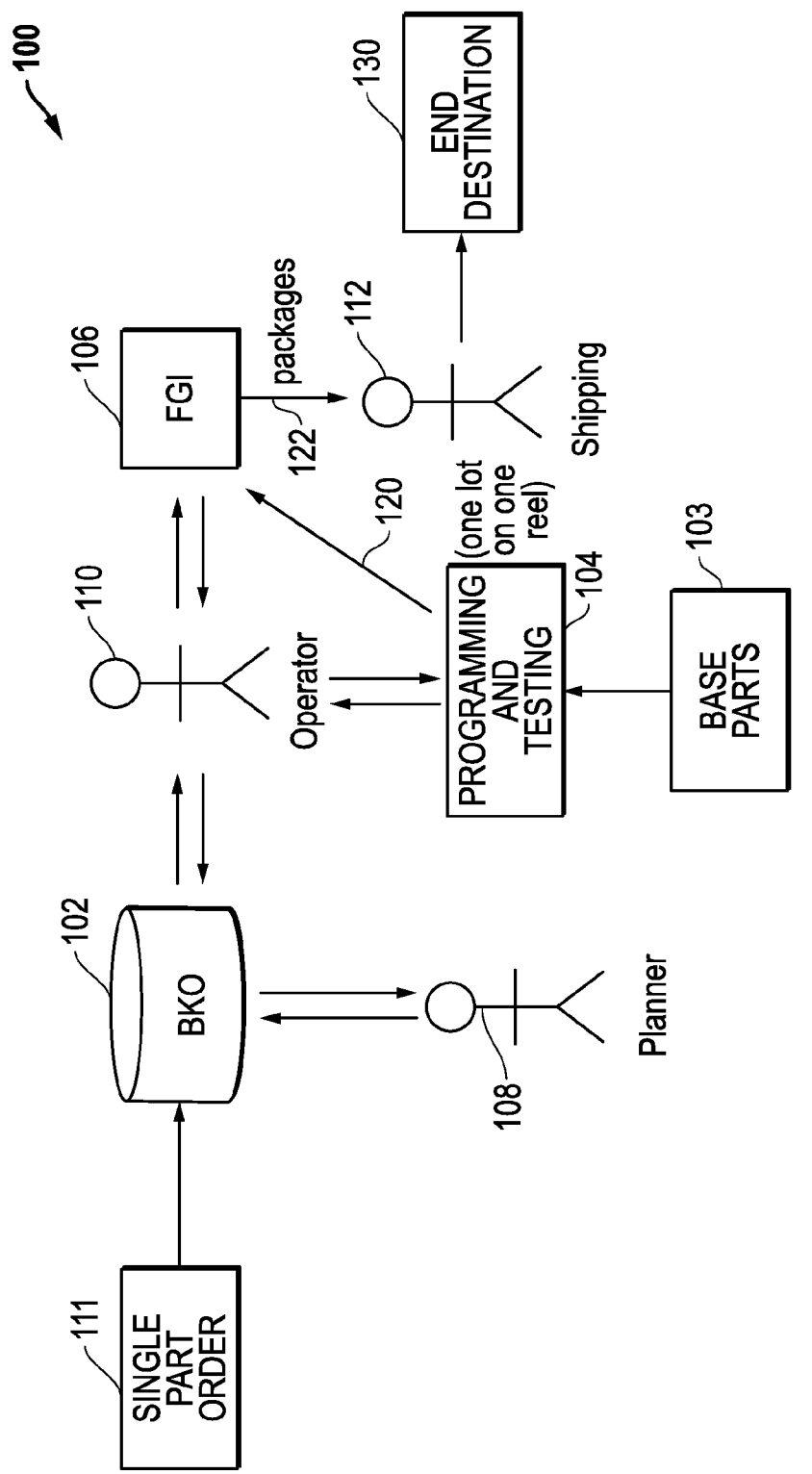
FIG. 1 illustrates a simplified block diagram of conventional architecture for part test and programming of custom horizontal integrated circuit (IC) device products.
Figure 2:
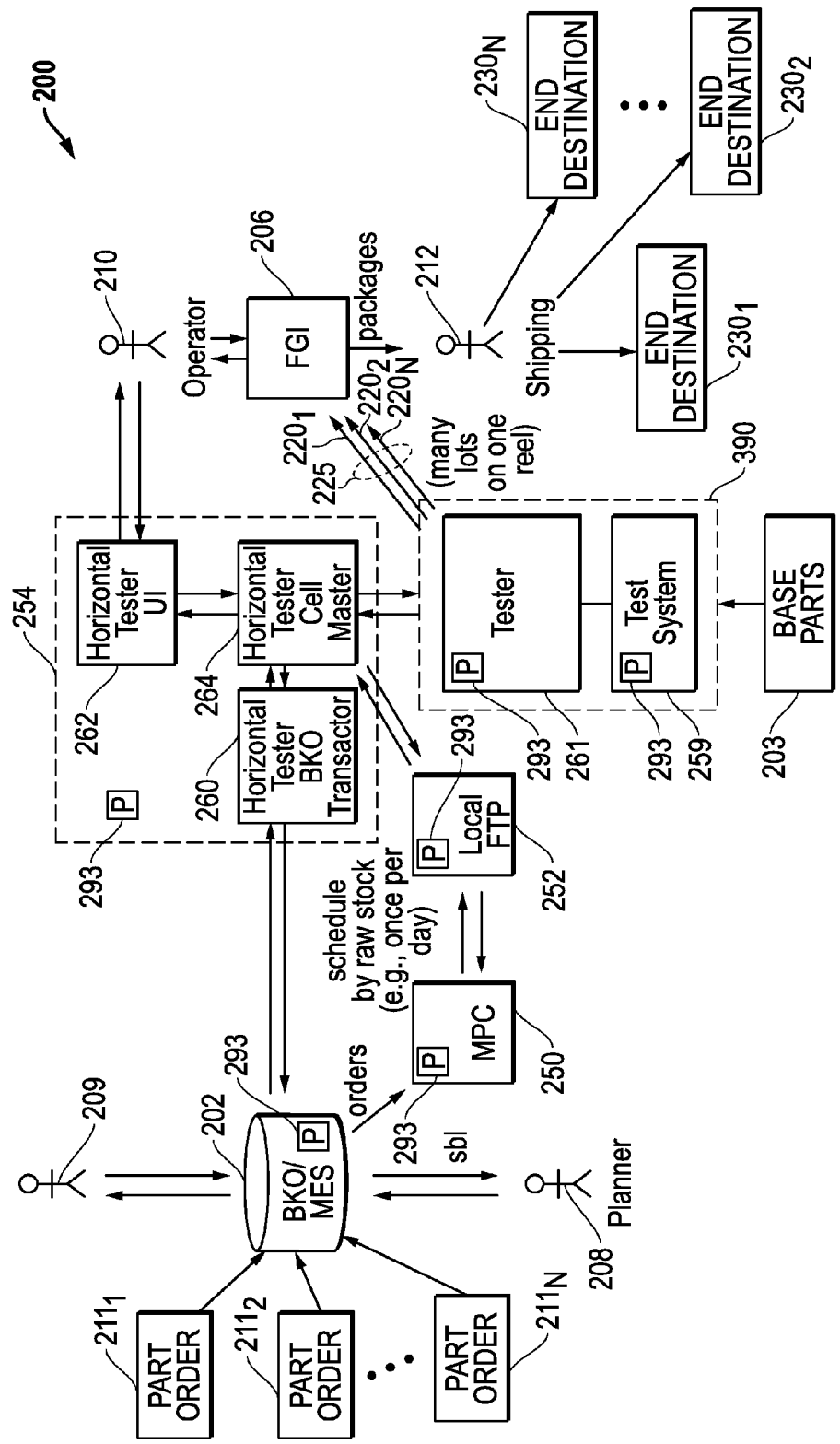
FIG. 2 illustrates a simplified block diagram of an architecture that may be employed to setup and run multiple aggregated custom IC device part orders at one time according to one exemplary embodiment of the disclosed systems and methods.
Figure 3:
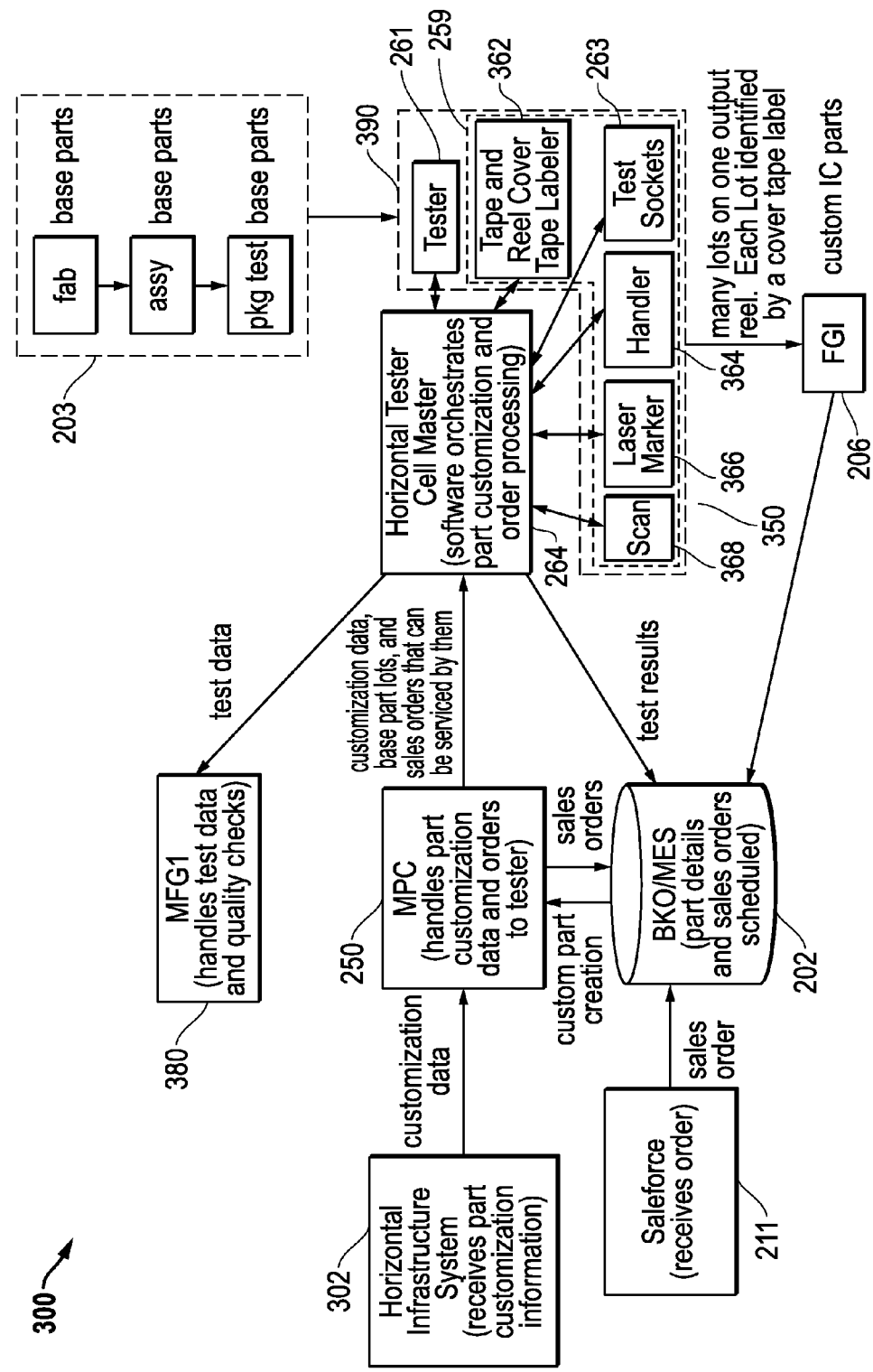
FIG. 3 illustrates a simplified block diagram of various hardware and logic components according to one exemplary embodiment of the disclosed systems and methods.

FIG. 2 illustrates an exemplary embodiment of an architecture 200 that may be employed to setup and run multiple aggregated custom IC device part orders at one time. In this embodiment, architecture 200 may be employed for part testing and programming of multiple different types of custom horizontal integrated circuit (IC) device products from a common type of multiple incoming uncustomized base IC device parts 203 that may be previously fabricated, assembled and packaged tested (e.g., base part testing) as shown in FIG. 3. As shown, multiple different individual custom IC device part orders $211_1$ to $211_N$ are provided to logic of combination bookkeeping, order and manufacturing execution system (BKO/MES) 202. Custom IC device part orders 211 may be received, for example, from one or more customers of an IC device product manufacturer. Each of multiple custom part orders 211 may specify a lot of the same type of multiple custom IC device parts corresponding to a particular custom part type (e.g., by part number, part name, etc.) having custom programming that is different from the custom programming of other different custom IC device part types specified by each of the other multiple custom part orders $211_1$ to $211_N$. As shown, a human planner 208 may interact with BKO/MES 202 (e.g., via graphical user interface I/O) by reading the details of the multiple custom IC device part orders $211_1$ to $211_N$ from BKO/MES 202 and then provides scheduling information to BKO/MES 202 (e.g., dates, etc.) that specifies scheduling for testing and programming of parts for each of the respective individual orders $211_1$ to $211_N$. A human product test engineer (PTE) 209 may also read statistical bin limit (SBL) and results of other IC test results from wafer-level, probe, and package testing that is performed on custom IC device parts that are programmed and tested by custom part test and program components 390.

In one embodiment, BKO/MES 202 may implemented as logic (e.g., software and/or firmware) executing on one or more processing devices 293 (e.g., such as CPU/s) of a computer server or computer workstation that itself is wired and/or wirelessly coupled to one or more networks (e.g., such as Internet and/or corporate intranet) to receive custom order information from customers or other users, and that is also wired or wirelessly coupled to input/output (I/O) device/s such as graphical user interface "GUI" displays, keyboards, mice, etc. so as to allow BKO/MES 202 to exchange data and control information with human planner 208 and human PTE 209. A computer server or computer workstation running BKO/MES 202 may also be coupled via suitable data bus and/or wireless data communication to exchange data and control information with other components of architecture 200 that execute on one or more processing devices 293 of the same or different computer server or workstation as BKO/MES 202 such that horizontal testing logic 254 and MPC 250 may communicate with BKO/MES 202 to automate lot processing transactions. Examples of such other components of architecture 200 include, but are not limited to, multi-platform configuration (MPC) server 250 and BKO/MES transactor 260 of horizontal testing logic 254. Particular examples of BKO/MES 202 include, but are not limited to System Application Products (SAP) R/3 System available from SAP SE of Walldorf, Germany; or any other suitable enterprise resource planning (ERP) systems such as available from Oracle, PeopleSoft, etc.

In the embodiment of FIG. 2, MPC server 250 may be a computer workstation or other type of server system having at least one processing device 293 (e.g., CPU) configured to query and access details of scheduled custom IC device part orders 211 from BKO/MES 202. MPC server 250 may also be configured to receive and transfer part customization details (e.g., such as specified firmware programming for the customized parts, specified firmware settings for the customized parts, custom part flags or values, customer provided firmware, custom marking information laser such as marking lines, testing for custom programming, etc.) that are received by MPC server 250 directly from a custom order information source (e.g., via a computer server) through file transfer protocol (FTP) server to horizontal testing logic 254 as will be described further herein with regard to FIG. 3. In one exemplary embodiment, individual part customization details may be managed by MPC server 250 using customer IC device part number, with BKO/MES not aware of these part customization details.

MPC server 250 may also be configured to analyze the part customization details of different (e.g. relatively small quantity such that multiple custom product orders can be contained on a single outgoing reel 225) custom product orders 211 and to aggregate the multiple orders $211_1$ to $211_N$ into groups of different orders 211 that may be programmed from a common compatible type of raw stock uncustomized base IC parts 203 (e.g., the same mother lot or base part number). In this regard, a first given mother lot may be compatible for use (e.g., programming) to produce the custom IC device parts of a group (e.g., subset) of one or more custom orders 211 (e.g., such as custom orders $211_1$, $211_2$, and $211_5$) but not compatible for use to produce the custom IC device parts of a different group (e.g., subset) of one or more different custom orders 211 (e.g., such as custom orders $211_3$, and $211_4$). Compatibility for fulfilling specifications of a given custom IC device part order may be based on, for example, physical and/or processing capabilities of the uncustomized base IC parts 203 of a given mother lot, e.g., such as part processing speed, part programming language, part memory size, part power consumption, physical size of individual part, part connector/pin number and/or identity, part connector/pin geometry and/or orientation, etc.

MPC server 250 may be provided with a processing device 293 (e.g., CPU) configured to access stored data (e.g., such as look up tables) that indicate what type of uncustomized base IC parts 203 is compatible to fulfill a given custom IC device part order 211 based on the customization details associated with the custom IC device part specified by the given order 211. In this regard, a compatible type of uncustomized base part 203 may be pre-assigned for producing a given type of custom IC device part based on customer or custom part manufacturer preference, and/or may be selected (e.g., by customer, custom part manufacturer or automatically by MPC 250) for producing a given type of custom IC device part based on suitability of the compatible type of uncustomized base part 203 for producing the given type of custom IC device part. Types of uncustomized base IC parts 203 that are unsuitable for producing a given type of custom IC device part include types of uncustomized base IC parts 203 that are incapable of being programmed according to the programming specifications for the given type of custom IC device part, or that otherwise cannot be used to meet one or more other physical and/or processing capability specifications of the given type of custom IC device part. Once multiple orders $211_1$ to $211_N$ have been aggregated into one or more groups to be programmed from one or more respective common types of uncustomized base IC parts 203, MPC server 250 may schedule each aggregated group of custom IC device part orders 211 to be fulfilled from a given type of raw stock uncustomized base IC parts 203 (i.e., in order to meet the original custom part scheduling information provided to BKS/MES 202 by planner 208), and to provide this scheduling information through FTP server 252 to processing device/s 293 executing horizontal testing logic 254.

Still referring to the embodiment of FIG. 2, one or more processing devices 293 (e.g., such as CPU, controller, microcontroller, processor, microprocessor, ASIC, FPGA, etc.) may be configured to execute IC tester and programming logic (e.g., software and/or firmware) for test system 259 that may be implemented to facilitate horizontal testing and custom programming in a manner as described further herein. In one exemplary embodiment, logic 254 may be executed on a computer server or computer workstation that is wired or wirelessly coupled (e.g., via Internet and/or corporate intranet) to exchange data and/or control information with processing devices 293 executing BKO/MES logic 202, as well as with custom IC device part test and program components 390. As shown, horizontal testing logic 254 includes horizontal test user interface 262 that may be wired and/or wirelessly coupled to input/output (I/O) device/s such as graphical user interface "GUI" displays, keyboards, mice, etc. to allow a human operator 210 to access data and to provide command information to horizontal testing logic 254. Other components of horizontal testing logic 254 include, but are not limited to, a BKO/MES transactor 260 that may be present to interface with BKO/MES 202 and that may be configured to automatically transact (e.g., or process the orders for fulfillment) the lots based on pre-specified order information and/or otherwise so that test system 259 may run automatically without stopping e.g., by locking the mother lot so no other tester can attempt to process it, by locking individual orders, creating sublots for each individual order, processing results of test and part customization, and unlocking mother lot remnant quantity and any unprocessed orders after processing is complete.

As further shown in FIG. 2, each of horizontal tester user interface 262 and BKO/MES transactor 260 are coupled to bi-directionally exchange data and any other applicable information with a horizontal tester cell master 264 that may itself be configured to monitor and control and orchestrate all programming, testing, handling and other operations performed by custom IC device part test and program components 390, e.g., including test system 259 components. In the illustrated embodiment, custom IC device part test and program components 390 include test system 259 and tester 261 which are described further herein. As shown, custom IC device part test and program components 390 are configured to receive incoming uncustomized base IC device parts 203 that are to be tested, customized (e.g., programmed), marked and handled by various custom IC device part test and program components 390. In this regard, incoming uncustomized base IC device parts 203 may be a group or "mother lot" of multiple identical IC device parts (e.g., cut or otherwise diced from the same device wafer) that are to be customized in different ways by custom IC device part test and program components 390.

In the embodiment of FIG. 2, test system 259 may include components such as a part handler, input media handler, daughter card with specific package sockets, vision scan, laser marker, output media packager, etc. that are configured to receive, test and program each individual uncustomized IC base part 203. Examples of such custom programming include, but are not limited to, custom frequencies, custom part flags or values, customer supplied firmware, laser mark lines, etc. Custom IC device part test and program components 390 may perform various different marking, labeling, and/or handling tasks to produce a single reel of tape media 225 that includes a covered carrier tape rolled on a take-up reel and that contains multiple different lots $220_1$ to $220_N$ of differently programmed custom IC device parts that correspond to different custom part orders $211_1$ to $211_N$, respectively. In this regard, a single reel of media 225 may be provided from test system 259 that contains differently programmed custom IC device parts as specified by the different custom part orders 211. For example, in one embodiment, a first custom IC device part lot $220_1$ of one type of multiple custom programmed parts may be placed near each other within part compartments of a given tape and reel media, while a second custom IC device part lot $220_2$ of another type of multiple custom programmed parts may be placed near each other within part compartments of the same given tape and reel media, etc.

Still referring to FIG. 2, each different type of custom programmed IC device parts contained in carrier tape part compartments of the same single reel 225 of media may be uniquely identified (e.g., either by individual part or as a lot 220 of individual parts) so that the parts of each different type may be differentiated from the parts of other different types of custom programmed parts (e.g., which are also by individual part or as a lot 220 of individual parts). Examples of suitable identification techniques that may be performed by test system 259 include, but are not limited to, applying a label that displays custom IC part identifier information (e.g., such as bar code) to the cover tape that is adjacent a group of part compartments of the carrier tape of the tape reel 225 that contain parts of the same corresponding part type, printing such custom part identifier information directly onto the cover tape that is adjacent a group of carrier tape part compartments of the tape reel 225 that contain parts of the same corresponding part type, etc. In another embodiment, it is possible that custom part identifier information may be applied to a surface of the carrier tape itself in a position adjacent a group of part compartments of the carrier tape of the tape reel 225 that contain parts of the same corresponding part type.

As further shown in FIG. 2, the resulting single reel of tape media 225 that contains multiple different types of custom IC device parts (e.g., grouped together in lots $220_1$ to $220_N$) may be provided (e.g., taken to shipping, managed with paper travelers and barcode readers, etc.) for finished goods inventory (FGI) processing 206 (e.g., a shipping operation where custom IC device parts are individualized and shipped as orders using singulation, shipping label, box, etc.), which in one embodiment may be controlled and monitored by human operator 210 as shown. In this regard, a tape media reel 225 may be transported in any suitable manner (e.g., manually by human operator 210 or by automated transport device such as conveyor belt, industrial robot, etc.).

Included among the types of tasks that may be performed during FGI processing 206 is identifying and differentiating between the different types of custom IC device parts contained in the part compartments of single reel of tape media 225 by reading the bar code or other type of identifier label information displayed on a section of the tape media cover of tape reel 225 that is located adjacent or on the part compartments that contain each different given type of custom IC device part. As different respective types of custom IC device parts corresponding to different custom IC device part orders 211 are identified in FGI 206, they may be segregated from other types of custom IC device parts taken from the same tape media reel 225 for shipping or other type of transportation to an appropriate end destination 230 that has been specified (e.g., in BKO/MES 202) by the corresponding custom IC device part order 211 for the given type of custom IC device parts. For example, in the illustrated embodiment of FIG. 2, custom IC device parts specified by different custom part orders $211_1$ to $211_N$ may be programmed from uncustomized base IC parts 203 and placed in respective lots $220_1$ to $220_N$ on tape media reel 225. The individual custom parts of each of IC device part lots $220_1$ to $220_N$ may then be identified and segregated for shipping to respective different end destinations $230_1$ to $230_N$ that correspond to the respective custom part orders $211_1$ to $211_N$.

FIG. 3 illustrates one exemplary embodiment of block diagram that functionally groups interrelated tasks of various hardware and logic components 300 (including those previously described above in relation to architecture 200 of FIG. 2). As shown in FIG. 3, each of custom part orders 211 are received by BKO/MES 202 from a custom order information source (e.g., via sales force from a customer) and specify order information that may include requested number of a particular custom IC device part type (e.g., including identity of a custom part type associated with the current order, number of individual custom parts ordered by the current order, shipping address for the completed custom parts, etc.). As shown, part customization information 302 corresponding to a new custom IC device part type (e.g., such as specified firmware programming for the particular specified type of custom IC device part, specified firmware settings for the particular specified type of custom IC device part, custom customer firmware, custom part flags or values, custom part marking such as laser marking, custom programming testing, etc.) may in one embodiment be separately provided (e.g., together with an assigned part number for the corresponding new custom IC device part) from a custom order information source automatically through a computer server to MPC 250 for the given type of ordered custom IC device part specified by order information 302. For example, part customization information 302 may be provided to MPC server 250 across a network such as Internet or intranet, etc. However, in an alternate embodiment, part customization information 302 may be maintained in pre-existing form on storage of MPC server 250.

In any case, MPC server 250 may request that BKO/MES 202 create the newly specified custom IC device part together with its identified appropriate uncustomized base IC device part in a part database of BKO/MES 202. MPC server 250 may also send the new part customization information 302 to horizontal tester cell master 264. In parallel, a customer may separately order a specific number of the new custom IC device parts by the particular assigned part number for the corresponding new custom IC device part and this order information may be provided (e.g., from a computer server) to BKO/MES 202 as shown. MPC 250 is configured to in turn retrieve existing part customization information 302 for a given custom IC device part specified by each custom IC device part order 211, and to associate this retrieved part customization information 302 with the given custom IC device part number. Then BKO/MES 202 may schedule the custom part order 211 with that custom IC device part number by providing the order information (e.g., number of custom parts, shipping address, customer identity) of a given type of custom part specified by each custom part order 211 to MPC server 250, which may also associate the corresponding part customization information 302 (e.g., specified firmware programming for the particular specified type of custom IC device part, specified firmware settings for the particular specified type of custom IC device part, custom frequencies, custom part flags or values, Customer supplied firmware, laser mark lines, etc.) using the custom IC device part number.

MPC server 250 may in turn aggregate the multiple orders $211_1$ to $211_N$ into a group of different orders 211 that it determines from its database may be programmed from a common type of raw stock uncustomized base IC parts 203 (e.g., a common mother lot of the same type of uncustomized base IC device parts). MPC server 250 may then provide this scheduled information (e.g., aggregated order information and corresponding uncustomized base part information) to horizontal tester cell master 264 of custom part test and program components 390. Horizontal tester cell master 264 is configured to in turn control other custom IC device part test and program components 390 (e.g., components of tester 261 and test system 259) to operate together to custom test, program, vision scan, and mark incoming uncustomized base IC parts 203 to produce different specified custom IC device part types for the aggregated orders 211 from the specified mother lot of incoming uncustomized base IC parts 203 that is specified by MPC server 250. In this way, MPC server 250 may be configured to control customization of uncustomized base IC parts 203 by providing information (e.g., aggregated order information and corresponding uncustomized base part information) to custom part test and program components 390 so that test system 259 correctly customizes uncustomized base IC parts 203 to build or otherwise produce custom IC device parts 403 (e.g., see FIG. 5) that fulfill the specifications of each order 211. In one embodiment, custom part test and program components 390 may be integrated together as a common piece of equipment such that these processing tasks (e.g., custom test, programming and marking) may be completed on the same piece of equipment without requiring marking (i.e., when post marking is optionally employed)

In the illustrated embodiment, horizontal tester cell master 264 may be configured to orchestrate part customization and custom IC device part order manufacturing by monitoring and controlling IC device part programming, testing, handling and other operations of test system 259 and tester 261 of custom IC device part test and program components 390. Test system 259 and tester 261 may be controlled and/or executed by different processing device/s 293, or may be integrated on a common machine that is controlled and/or executed by a common processing device/s 293. As shown, examples of possible components of test system 259 may include tape and reel tape labeler 362, handler 364, laser marker 366, scanner 368, etc. It is possible that each of these individual hardware components 362, 364, 366 and/or 368 may further be configured with its own processing device/s 293 for controlling its operation. For example, each of labeler 362 and handler 364 may include its own computer workstation and CPU which controls its operation and provides user interface for human operator/s. Such processing devices and/or computer workstations may be communicatively coupled to a processing device 293 (e.g., that is executing horizontal testing logic 254) of horizontal tester cell master 264 to allow data and control information to be wired or wirelessly exchanged between horizontal tester cell master 264 and the individual custom IC device part test and program components 390. It will also be understood that it is possible that two or more of individual hardware components 263, 362, 364, 366 and/or 368 may be controlled by a common (same) processing device, computer workstation, etc.

Still referring to FIG. 3, multiple incoming bulk base IC device parts 203 may be fabricated (e.g., on a common wafer), singulated and then assembled and package tested before being made available as raw stock to custom part test and program components 390 for custom programming and testing under the control and orchestration of horizontal tester cell master 264. In this regard, a human operator 210 of FIG. 2 may access a custom IC device part build plan information (e.g., via horizontal tester UI 262) that specifies a given type of uncustomized base IC device parts 203 as a common mother lot for a given group of aggregated orders 211 as scheduled by MPC server 250, and that is displayed under control of horizontal tester cell master 264. Based on the custom IC device part build plan information, the human operator may select and load a tape media reel that contains the type of mother lot uncustomized base IC parts 203 specified by the custom IC device part build plan information for access by custom IC device part test and program components 390. In an alternate embodiment, this selection and loading of a mother lot may be automatically performed, e.g., by industrial robot.

These incoming uncustomized base IC device parts 203 may be provided in separate part compartments of an incoming reel of tape and real media. In this regard, only as many of a given type of incoming uncustomized base IC parts 203 may be provided at a given time that are required to satisfy the number of uncustomized base IC parts 203 needed to fulfill a given custom IC device part order 211, or that are required to satisfy the number of uncustomized base IC parts 203 needed to fulfill a given number of groups of aggregated multiple custom IC device part orders $211_1$ to $211_N$ that may be programmed from a common type of raw stock uncustomized base IC parts 203. In one embodiment, the number of incoming uncustomized base IC device parts 203 needed to satisfy each given custom IC device part order 211 may be split or singulated from the tape media of an incoming tape reel for customization prior to output together as separate identified custom IC device part sublots $220_1$ to $220_N$ in compartments of a continuous carrier tape of a single common outgoing tape reel 225, e.g., without stopping or interrupting operation of custom part test and program components 390. In one embodiment, different lots of the same type of raw stock uncustomized base IC device part 203 may be taken from different respective incoming tape reels and tested/programmed by custom part test and program components 390 to manufacture multiple different custom IC device part lots $220_1$ to $220_N$ that are output together as separate identified lots in a single common outgoing tape media reel 225. With fast hardware IC socket change over, the same custom part test and program components 390 (e.g., including components of test system 259) may be used to program different uncustomized base IC device parts 203 having different package types.

In one embodiment, horizontal tester cell master 264 may control custom IC device part test and program components 390 to run multiple aggregated custom IC device part orders $211_1$ to $211_N$ according to a schedule specified by MPC server 250 from the currently loaded type (e.g., part number) of mother lot tape media reel. As described further herein, horizontal tester cell master 264 may control custom part test and program components 390 by retrieving the lot number of each given sublot 220 of custom IC device parts from BKO 202 as well as the specified test program, and monitoring the custom IC device part test results. In this manner horizontal tester cell master 264 may control custom part test and program components 390 to test, custom program, custom mark, and scan each custom IC device part sublot 220 corresponding to a given one of the aggregated custom IC device part orders $211_1$ to $211_N$, and to output each of sublots $220_1$ to $220_N$ together in the same reel of tape and reel media 225. In one embodiment, the sublots $220_1$ to $220_N$ may be output together with empty pockets in between different sublots 220 of custom IC device parts that are labeled with a tape and reel media cover tape label (or other type of suitable marking) that indicate each sublot 220 and its corresponding custom IC device part type. In this regard, multiple sublots $220_1$ to $220_N$ corresponding to an aggregated group of custom IC device part orders $211_1$ to $211_N$ may be all output on a single output reel, and with horizontal tester cell master 264 and custom part test and program components 390 running unattended or substantially unattended by any human operator. After horizontal tester cell master 264 and custom part test and program components 390 have completed manufacture of multiple sublots $220_1$ to $220_N$ corresponding to a given aggregated group of custom IC device part orders $211_1$ to $211_N$, the single output reel containing these multiple sublots $220_1$ to $220_N$ may be transferred to FGI 206 for separation and shipping.

In any case, when incoming uncustomized base IC device parts 203 are received by components of test system 259 of custom part test and program components 390, they first may be programmed by tester logic 261 (e.g., firmware and/or software) via part customization insertion new programming may be flashed in one or more test sockets 263. Thereafter firmware programming may be verified and any other needed or desired testing (e.g., using high voltage circuitry), if any, performed by tester logic 261 in test sockets 263. In one embodiment, one or more components of test system 259 may be implemented by a packaged part automatic test equipment (ATE) system that includes test socket/s with Interface Test Adapter (ITA) configured to receive and electronically couple to pins and circuits of the incoming uncustomized base device part under test (DUT), although any other device testing equipment or methodology may be employed that is suitable for testing and custom programming uncustomized base IC parts 203 in a manner as described elsewhere herein. For example, in one embodiment, testing and programming may occur in different sockets, and in another embodiment only custom programming may be performed without testing.

In a further embodiment, handler 364 may be controlled by horizontal tester cell master 264 to place each of the incoming uncustomized base IC device parts 203 into the test socket/s of the ATE for testing and custom programming, and then to remove and transfer each produced custom programmed IC device part to other components of custom part test and program components 390. Handler 364 may be controlled by horizontal tester cell master 264 to place the thus-produced multiple individual custom programmed IC device parts into respective individual part compartments of an outgoing tape reel 225 that is then covered with a cover tape. Examples of such other components of custom part test and program components 390 include, but are not limited to, optional laser marker 366 that may be configured to mark custom part type identifier information indicia on the individual custom programmed parts, optional scanner 350 (e.g., one or more cameras) that may be configured to 2D or 3D image each IC device part from one or more sides to verify no damage to package or leads, to verify package assembler markings, and tape and reel tape labeler 362 that is configured to apply custom part identifier information (e.g., such as bar code) to the tape and reel cover tape that is adjacent a group of tape part compartments of the tape reel 225 that contain parts of the same corresponding part type. It will be understood that custom part identifier information may be so applied to tape media of an outgoing tape reel 225 using any suitable type of marking and/or labeling technology, e.g., such as using adhesive labeling or ink jet printing the custom part identifier information on the cover tape and/or labeling or printing the custom part identifier information on other portion's of the tape media (other than the cover tape) and that is adjacent a group of tape part compartments of the outgoing tape reel 225 that contain a lot 220 of custom IC device parts of the same type (that are programmed from a single incoming mother lot of the same type of uncustomized base IC parts 203 or that are programmed from multiple different incoming mother lots of different respective types of uncustomized base IC parts 203).

As illustrated in FIG. 3, multiple different sublots 220 of different types of respective custom IC device parts contained in part compartments of a single outgoing tape reel 225 may be provided (e.g., manually by human operator 210 or by automated transport device such as conveyor belt, industrial robot, etc.) to finished good inventory (FGI) processing 206. As previously described, human operators and/or automatic processing equipment of FGI processing 206 may operate to identify and differentiate between the groups or lots of different types of custom IC device parts contained in the part compartments of single reel of tape media 225 by reading the bar code label or other type of identifier information displayed on a section of the tape media cover of tape reel 225 that is located adjacent or on the part compartments that contain each respective different given type of custom IC device part. As different respective lots of custom IC device parts resulting from different custom IC device part orders 211 are identified in FGI 206, they may be segregated or singulated from other lots of custom IC device parts taken from the same tape media reel 225 and shipped to an appropriate end destination 230 (e.g., destination name and address) that has been specified (e.g., in BKO/MES 202) for each given lot of custom IC device parts as illustrated and described in relation to FIG. 2. As shown, in one embodiment FGI 206 may read the identifier (e.g., bar code) information from the labeled tape media cover of tape reel 225 and use this information to query BKO/MES 202 and obtain destination information (e.g., destination name and address) for shipping each lot of corresponding custom IC device parts.

It will be understood that in one alternative embodiment, two or more different custom IC device part orders 211 may be received by BKO/MES 202 that specify the same type of custom IC device parts (e.g., having the same type of custom programming), but destined for different customers or end destination shipping addresses. In such a case, a single outgoing tape reel 225 may contain multiple different segregated lots of the same type of custom IC device parts, in which case the different lots of the same type of custom IC device parts may be identified and differentiated in FGI 206 from other lots of the same type of custom IC device parts for singulation and shipping to the corresponding end destination specified for each given lot by the corresponding custom IC device part order 211. In this regard, and outgoing tape reel 225 may be post processed in FGI 206 by reading information from each tape and reel cover tape label (or other indicator) to determine the identity of a corresponding sublot $220_X$ of custom IC device parts, cutting the tape and reel media to singulate the custom IC device parts of the given sublot $220_X$, transacting this sublot $220_X$ in BKO/MES 202 by barcode automated processing, and placing the sublot $220_X$ in a box or other container for shipping to a given end destination $230_X$ (e.g., customer) that is specified by a corresponding order $211_X$. This process may be repeated in FGI 206 for all sublots $220_1$ to $220_N$ contained in the same reel 225 to satisfy all completed aggregated custom IC device part orders $211_1$ to $211_N$. Following fulfillment of a first group of aggregated IC device part orders $211_1$ to $211_N$, a second group of multiple aggregated IC device part orders 211 may be similarly processed (e.g., from another and different mother lot of IC uncustomized base IC parts 203) for output as corresponding multiple separate sublots 220 of custom IC device parts in another and different outgoing tape reel 225.

As further illustrated in FIG. 3, horizontal tester cell master 264 may be configured and coupled to provide test data generated by the test system 259 (e.g., yield, part lots on hold, date/time, test equipment used, parametric data, functional test results etc.) to manufacturing operations system (MFG1) 380 that may be executing as logic (e.g., software, firmware, etc.) as a system of servers, file systems, and databases. MFG1 380 may also be configured to handle reported test data and quality checks, e.g., tracking part yield, bin good, bin bad, put lots on hold, provide engineering analysis tools to aid with disposition of poor yield lots, etc.

Figure 4:
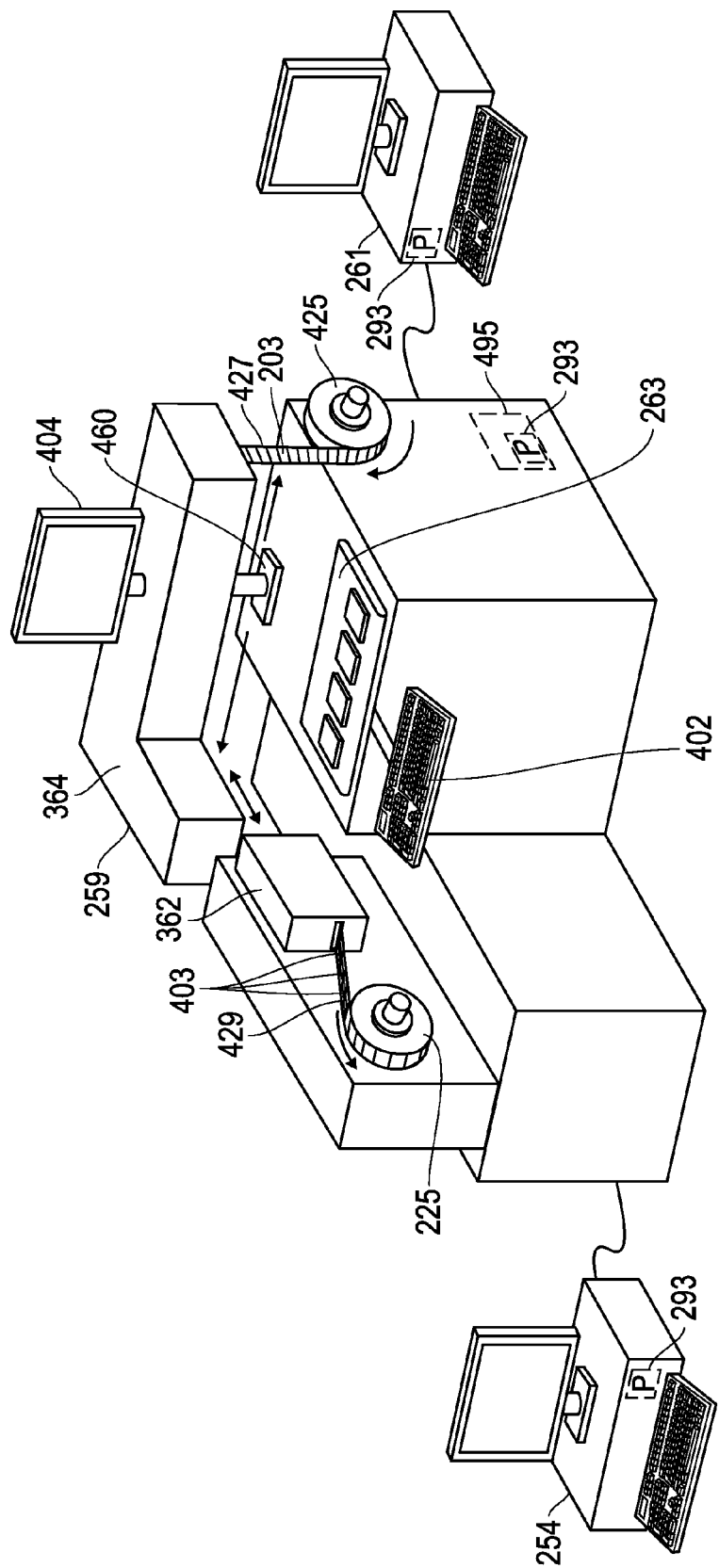
FIG. 4 illustrates test system components communicatively coupled to tester and horizontal testing logic according to one exemplary embodiment of the disclosed systems and methods.

FIG. 4 illustrates one exemplary embodiment of components of test system 259 as they may be integrated into a single horizontal testing machine and communicatively coupled to tester 261 and horizontal testing logic 254, it being understood that any one or more of test system 259 components may alternatively implemented as discrete components. As previously described, custom IC device part test and program components 390 (that include test system 259) may include one or more processing devices 293 and associated memory and/or storage that are configured to control operations of the various components. For example, in the illustrated embodiment of FIG. 4, the integrated components of test system 259 may include at least one integrated computer workstation, desktop computer, or other operatively coupled arrangement of computer components 495 (e.g., CPU, non-volatile random access memory "NVRAM", non-volatile storage such as hard drive, DRAM, graphics processing unit, network interface controller, etc.) that is configured to communicate with logic of horizontal tester cell master 264 to control operation of the various components of test system 259 and to interface with a human operator 210 in a manner as previously described, e.g., via UI 262 of coupled horizontal testing logic 254 which in this embodiment may be executing on a separate computer server, workstation, etc. that is wired and/or wirelessly coupled to computer components 495. Computer components 495 may also interface via one or more networks or other communication paths with other processing devices 293 and networks described in relation to FIG. 2, such as tester 261. Display monitor 404 and keyboard or other I/O device 402 may be provided for controlling and monitoring handler 364.

In the embodiment of FIG. 4, a reel 425 of incoming carrier tape media 427 (e.g., 8 mm tape, 12 mm tape, etc.) that contains a single mother lot of identical uncustomized base IC device parts 203. Each of incoming uncustomized base IC device parts 203 is detaped by handler 364 and then moved (e.g., by a pick and place robot 460) between individual test stations (e.g., sockets 263, etc.) for testing and programming to produce a custom IC device part 403 as previously described. Programming of custom IC device parts 403 may be scheduled such that custom programming of all custom IC device parts 403 corresponding to a given custom part order $211_X$ are performed back to back or sequentially as a group, e.g., as a single outgoing lot $220_X$ of custom IC device parts 403. Each of custom IC device parts 403 of each outgoing lot 220 is then transferred (e.g., by a pick and place robot 460) to tape and reel tape labeler 362 which is configured to place each custom IC device part 403 into a separate part compartment of outgoing carrier tape media 429, which may be a single continuous length of carrier tape that may be wound on a single take-up reel.

As previously described, the custom IC device parts 403 of a given outgoing lot 220 may be placed in adjacent part compartments (or otherwise grouped together) in the outgoing carrier tape media 429 (e.g., 8 mm tape, 12 mm tape, etc.). Tape and reel tape labeler 362 may then apply a cover tape 502 (shown in FIG. 5) over the outgoing carrier tape media 429 and its custom IC device parts 403, and apply custom part identifier information (e.g., such as bar code printed or sticky label) on the tape media cover tape that is positioned adjacent a group of carrier tape part compartments of the tape reel 225 that contain parts of the same corresponding part type, before being wound onto a take-up reel of outgoing tape reel 225 as shown. It will be understood that it is possible to include two or more different tape and reel cover tape labelers 362 (e.g., that produce different size tape media such as 8 mm and 12 mm respectively) as part of a single integrated machine of test system components 259 of custom IC device part test and program components 390, e.g., to allow handler 364 to selectively provide custom IC device parts 403 to one of the multiple tape and reel cover tape labelers 362 that produces the desired size of outgoing tape media (e.g., 8 mm or 12 mm). Any suitable combination of carrier tape media, cover tape, and take-up reel may be utilized in the practice of the disclosed systems and methods. One example is carrier tape, cover tape and take-up reel components available from Advantek of Laguna City, Philippines. Such example components include, but not limited to, tri-laminate, polycarbonate, and polystyrene carrier tapes; heat activated and pressure sensitive cover tapes; and plastic take up reels (e.g., high-impact injection-molded polystyrene in 7", 13", 15", and 22" diameters).

Figure 5:
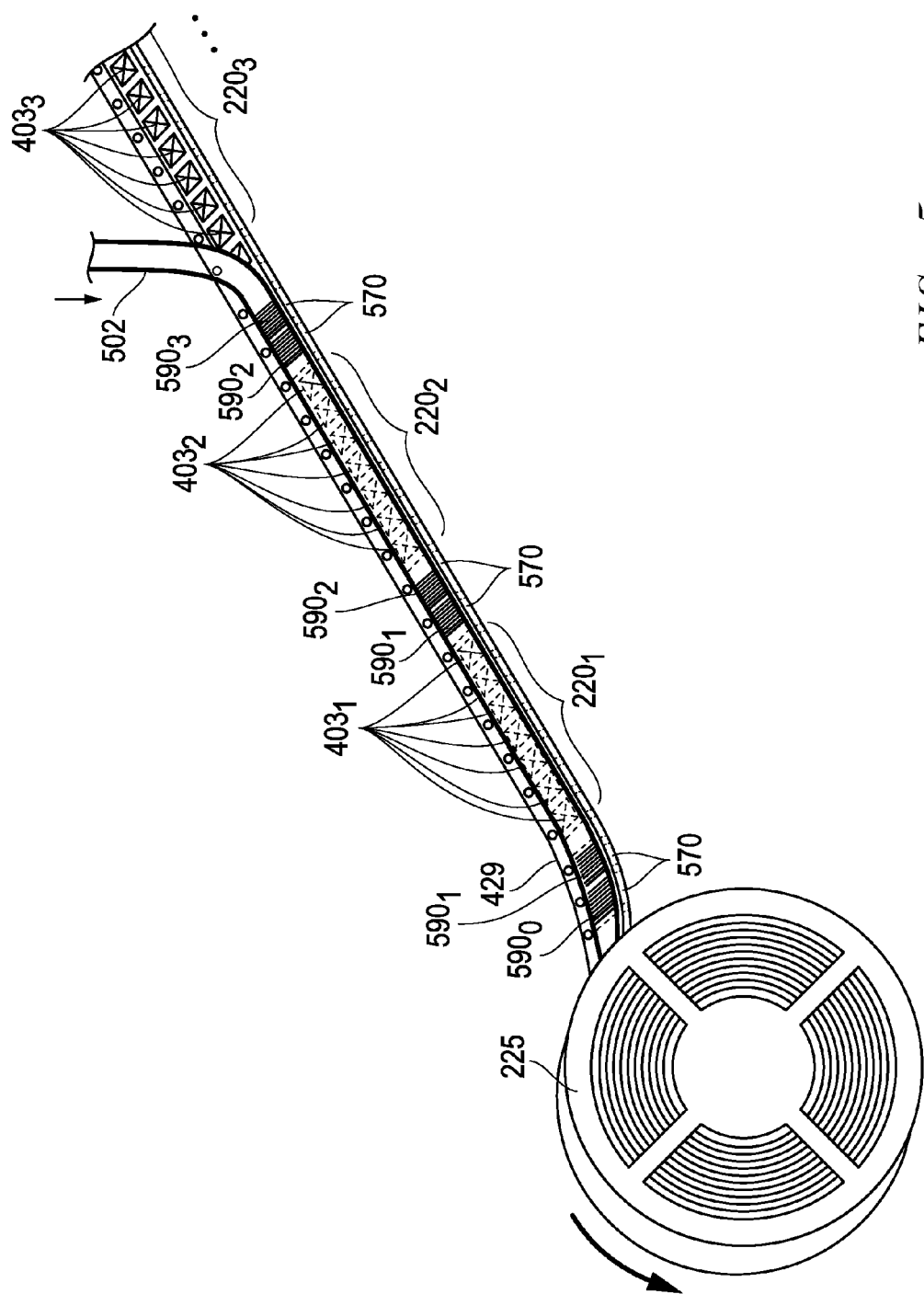
FIG. 5 illustrates a reel of outgoing tape media containing custom IC device parts according to one exemplary embodiment of the disclosed systems and methods.

FIG. 5 illustrates a reel 225 of outgoing continuous carrier tape media 429 that includes individual part compartments sized to contain individual custom IC device parts 403. In the illustrated embodiment, multiple lots $220_1$, $220_2$, $220_3$, etc. of respective types of outgoing custom IC device parts $403_1$, $403_2$, $403_3$, etc. have been grouped together in adjacent part compartments of a continuous (not-separated) segment or length of carrier tape media 429 prior to covering and sealing the part compartments with cover tape 502 and winding up the continuous segment of covered carrier tape on the take-up reel as shown. As further shown, respective custom part identifier information $590_0$, $590_1$, $590_2$, $590_3$, etc. has been applied (e.g., as printed 2D or data matrix bar code, physical adhesive label with 2D or data matrix bar code, etc.) on the cover tape adjacent (and in this example on each side of) each lot of custom IC device parts 403 to identify the particular custom IC device parts 403 (e.g., by particular part order 211, by part type, etc.) in a manner as previously described. Individual custom IC device parts 403 that are covered by cover tape 502 are illustrated with dashed hidden lines in FIGS. 5 and 6, i.e., in FIG. 5 individual custom IC device parts $403_1$ of lot $220_1$ are illustrated in dashed hidden outline between bookended custom part identifier information segments $590_1$ that uniquely identify custom IC device parts $403_1$, and individual custom IC device parts $403_2$ of lot $220_2$ are illustrated in dashed hidden outline between bookended custom part identifier information segments $590_2$ that uniquely identify custom IC device parts $403_1$. Individual custom IC device parts $403_3$ of lot $220_3$ are visible and not yet covered by cover tape 502 which is being applied to tape 429 as shown by the arrow in FIG. 5. Individual custom IC device parts $403_0$ of a preceding adjacent lot $220_0$ are not shown as they are already wound on reel 225.

After the continuous segment of covered carrier tape 429 has been wound on the take up reel to form a first outgoing tape media reel 225, the carrier tape 429 and its cover may be severed or cut and the outgoing reel of media 225 removed from test system 259 for further handing. A new take-up reel may then be installed on test system 259 and a new continuous segment of covered carrier tape 429 (containing one or more different lots of corresponding custom IC device parts 403) may be wound on the new take-up reel to form a second and different outgoing tape media reel 225. It will be understood that FIG. 5 is illustrative only and that more than three lots 220 of outgoing custom IC device parts 403 may be grouped together in adjacent part compartments of a single common (i.e., continuous and non-severed) segment of carrier tape 429, with each lot 220 of custom IC device parts 403 being labeled with respective custom part identifier information 590 as described above.

Figure 6:
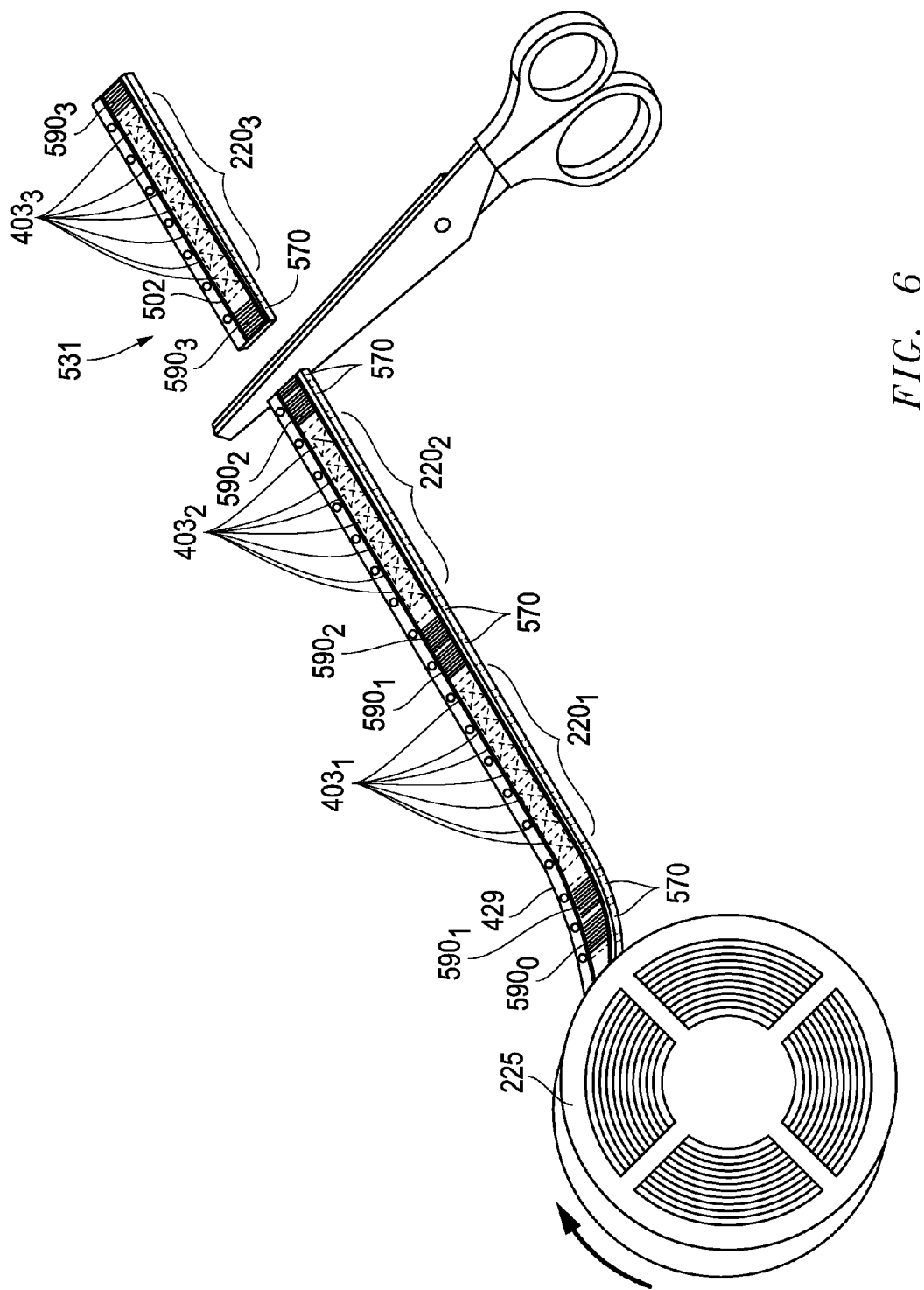
FIG. 6 a reel of tape media containing custom IC device parts according to one exemplary embodiment of the disclosed systems and methods.

In the illustrated embodiment, the part identifier information 590 (e.g., including lot number, custom ordered part number "OPN", quantity of parts in the lot, etc.) has been applied over empty part compartments 570 to each side of the individual custom IC device parts 403 of each respective lot 220 to provide a labeling bookend. In this regard, one or more empty part compartments 570 may be left between different adjacent lots 220 to assist in easy identification of the custom IC device parts 403 of different respective lots $220_1$, $220_2$, $220_3$, etc. when they are later singulated and separated as a lot in a singulated tape segment (such as singulated tape segment 531 of FIG. 5 that contains custom IC device parts $403_3$ of lot $220_3$ between custom part identifier information $590_3$ that uniquely identify custom IC device parts $403_3$) from the rest of carrier tape media 429 of reel 225 for shipment as an individual lot within the singulated and separated carrier tape media segment 531 (and with attached bookended identifiers 590 on either end of each segment) to different respective end destinations 230 as shown in FIG. 6, e.g., at an end destination 230 cover tape 502 may then be removed from singulated tape segment 531 to expose and access and remove the underlying individual custom IC device parts 403. When so provided, empty part compartments 570 also provide a convenient area where carrier tape media may be cut or otherwise separated between different lots 220 for boxing and shipping. It will be understood that part identifier information 590 may be placed and/or attached relative to a corresponding given lot 220 of custom IC device parts 403 in any location suitable for allowing identification of the particular custom IC device parts 403 that correspond to the given lot 220, i.e., at either one or both ends (uptape end and/or downtape end) of the given lot 220 of custom IC device parts 430 with the latter bookended embodiment being illustrated in FIGS. 5 and 6.

In one exemplary embodiment, operator 212 of FIG. 2 may read the custom part identifier information 590 (e.g., scan the barcode of the tape and reel label/s 590) for each given detaped lot 220 of devices 403, transact the shipment of the given lot 220 in BKO/MES 202 to determine the shipment details of the original custom part order 211 corresponding to the current given lot 220, and box and ship or otherwise transport the custom IC device parts 403 of the given lot 220 to the end destination 230 specified by the original corresponding custom part order 211, e.g., within a singulated segment 531 of tape media. It will be understood that one or more of the preceding steps may be alternatively implemented in automated fashion without human operator 212, e.g., such as using automated robot, scanning, labeling, packaging and/or shipping equipment that operate under the control of one or more processing devices 293 that are communicatively coupled to BKO/MES 202.

It will be understood that FIGS. 5 and 6 are exemplary only, and that part identifier information 590 may be applied or printed in any other manner that is suitable for allowing individual custom IC device parts 403 of different outgoing multiple lots 220 contained in the carrier tape media 429 in the same reel 225 to be later identified and separated or otherwise distinguished from custom IC device parts 403 of the other multiple lots 220 on the same reel 225. For example, it is not necessary that any empty part compartments be left between the parts 403 of different lots (e.g., custom part identifier information 590 for each lot 220 may be positioned to be coextensive with the IC device parts 403 of the given lot 220 by extending from the first to last IC device parts 403 of the given lot 220 without extending to cover IC device parts 403 of any other adjacent lot 220). As another possible alternative, custom part identifier information 590 may be printed or applied between part compartments of carrier tape media 429 that contain different lots 220 of custom IC device parts 403 so that parts 403 of adjacent lots 220 may be distinguished from each other based on the presence of the intervening custom part identifier information 590 between the different lots 220.

Figure 7:
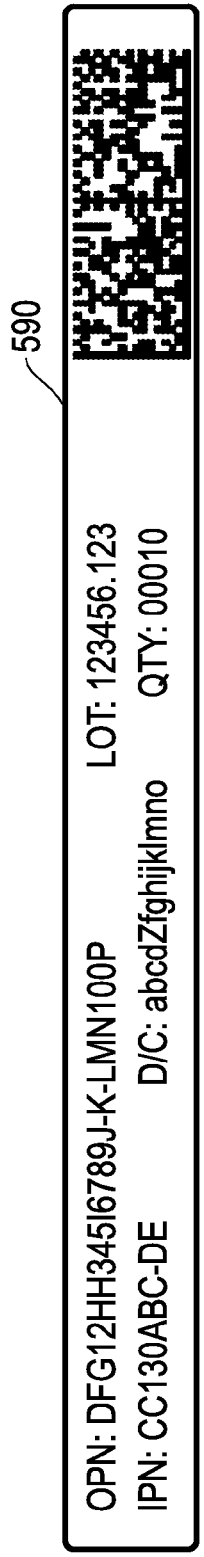
FIG. 7 illustrates custom part identifier information according to one exemplary embodiment of the disclosed systems and methods.

FIG. 7 illustrates an exemplary embodiment of custom part identifier information 590 as it may be printed or otherwise applied as described herein. In this exemplary embodiment, custom part identifier information 590 includes the following information for a particular lot 220 of custom IC device parts 403: custom ordered part number (OPN), internal part number (IPN), lot number (LOT), date code (D/C) and quantity (QTY). It will be understood that FIG. 7 is exemplary only and that additional, fewer or alternative types of information may alternatively be included in custom part identifier information 590, and that custom part identifier information 590 may be provided in any other suitable format, e.g., all human readable text or other human readable format, all barcode format of any suitable type (1D, 2D, etc.), any combination of human readable format and barcode (including duplicating some or all of the identifier information in both human readable format and barcode), etc.

It will be understood that one or more of the tasks, functions, or methodologies described herein (e.g., including those described herein for components 202, 250, 252, 254, 259, 261, 263, 264, 362, 364, 366, 368, 390, 495 etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed (e.g., executed on a processing device of an information handling system such as CPU, controller, microcontroller, processor, microprocessor, FPGA, ASIC, or other suitable processing device) to perform one or more steps of the methodologies disclosed herein. In one embodiment, such processing devices may be selected from the group consisting of CPU, controller, microcontroller, processor, microprocessor, FPGA, and ASIC. A computer program of instructions may be stored in or on the non-transitory computer-readable medium accessible by an information handling system for instructing the information handling system to execute the computer program of instructions. The computer program of instructions may include an ordered listing of executable instructions for implementing logical functions in the information handling system. The executable instructions may comprise a plurality of code segments operable to instruct the information handling system to perform the methodology disclosed herein. It will also be understood that one or more steps of the present methodologies may be employed in one or more code segments of the computer program. For example, a code segment executed by the information handling system may include one or more steps of the disclosed methodologies.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A system configured to produce customized integrated circuit (IC) device parts from multiple incoming uncustomized base IC parts, comprising:

a test system comprising one or more test sockets, a handler, and an outgoing tape reel configured to receive elongated carrier tape wound on the outgoing tape reel; and at least one processing device configured to communicate with the test system and programmed to control the handler to place each of multiple incoming uncustomized base IC device parts into the test sockets for custom programming to produce multiple custom programmed IC device parts, and then to remove and transfer the multiple custom programmed IC device parts into individual part compartments of a common carrier tape of the outgoing tape reel and cover the custom programmed IC device parts within the individual part compartments with a cover tape over the individual part compartments;

where the at least one processing device is further configured to communicate with the test system and programmed to:

control test socket custom programming of a common type of uncustomized base IC parts in different ways so as to produce respective different types of custom IC device parts specified by different custom IC part orders, the produced different types of custom IC device parts including a first type of custom IC device parts programmed from the common type of uncustomized base IC parts according to the specifications of a first custom IC part order, and a second type of custom IC device parts differently programmed than the first type of custom IC device parts from the same common type of uncustomized base IC parts according to the different specifications of a second custom IC part order, and then control positioning the first and second types of custom IC device parts specified by the respective first and second custom IC part orders into separate part compartments defined in the common carrier tape of a single outgoing reel of tape media.

2. The system of claim 1, further comprising at least one processing device configured to communicate with the test system and programmed to:

control the handler to position the first type of custom IC device parts specified by the first custom IC part order as a first lot of multiple custom IC part devices inserted into adjacent separate part compartments defined in the common carrier tape of a single outgoing reel of tape media, and control the handler to position the second type of custom IC device parts specified by the second custom IC part order as a second lot of multiple custom IC part devices inserted into adjacent separate part compartments defined in the common carrier tape of the single outgoing reel of tape media.

3. The system of claim 2, where the test system further comprises a tape reel tape labeler; and where the system further comprises at least one processing device configured to communicate with the test system and programmed to:
control the tape reel tape labeler to place first unique custom part identifier information on the common carrier tape or tape cover adjacent the separate part compartments containing the first lot of multiple custom IC part devices specified by the first custom IC part order;
control the tape reel tape labeler to place second unique custom part identifier information on the common carrier tape or tape cover adjacent the separate part compartments containing the second lot of multiple custom IC part devices specified by the second custom IC part order;
where the first unique custom part identifier information identifies the first custom IC part order and where the second unique custom part identifier information identifies the second custom IC part order.

4. The system of claim 2, further comprising at least one processing device coupled to the test system to:
control the handler to position the first type of custom IC device parts specified by the first custom IC part order as a first lot of multiple custom IC part devices inserted into a first group of adjacent separate part compartments defined in the common carrier tape of the single outgoing reel of tape media; and
control the handler to position the second type of custom IC device parts specified by the second custom IC part order as a second lot of multiple custom IC part devices inserted into a second group of adjacent separate part compartments defined in the common carrier tape of the single outgoing reel of tape media such that one or more empty part compartments are left between the first lot of multiple custom IC part devices inserted into a first group of adjacent separate part compartments and the second lot of multiple custom IC part devices inserted into a second group of adjacent separate part compartments.

5. The system of claim 4, further comprising at least one processing device coupled to the test system to:
control the handler to place a cover tape over the first and second lots of multiple custom IC part devices inserted into separate part compartments defined in the common carrier tape of the single outgoing reel of tape media; and
control the tape reel tape labeler to place first unique custom part identifier information on the cover tape over the one or more empty part compartments left between the first lot of multiple custom IC part devices and the second lot of multiple custom IC part devices, the first unique custom part identifier information identifying the first custom IC part order.

6. A system configured to produce customized integrated circuit (IC) device parts from multiple incoming uncustomized base IC parts, comprising:
a test system comprising one or more test sockets, a handler, and an outgoing tape reel; and
at least one processing device configured to communicate with the test system and programmed to control the handler to place each of multiple incoming uncustomized base IC device parts into the test sockets for custom programming to produce multiple custom programmed IC device parts, and then to remove and transfer the multiple custom programmed IC device parts into individual part compartments of a common carrier tape of the outgoing tape reel and cover the custom programmed IC device parts within the individual part compartments with a cover tape over the individual part compartments;
where the at least one processing device is further configured to communicate with the test system and programmed to:
control test socket custom programming of a common type of uncustomized base IC parts in different ways so as to produce respective different types of custom IC device parts specified by different custom IC part orders, and
then control positioning the different types of custom IC device parts specified by the different custom IC part orders into separate part compartments defined in the common carrier tape of a single outgoing reel of tape media;
where the handler is configured to receive an incoming reel of tape media that contains a single mother lot of a selected common type of identical incoming uncustomized base IC device parts; and at least one processing device configured to communicate with the test system and programmed to:
analyze part customization information corresponding to multiple custom IC device part orders, each of the multiple custom IC device part orders specifying a type of custom IC device part that is different from the type of custom IC device parts specified by the other multiple custom IC device part orders,
aggregate the multiple custom IC device part orders into at least one group of aggregated custom IC part orders specifying respective different types of custom IC device parts to be produced from the selected common type of compatible uncustomized base IC parts,
control the handler to transfer each of multiple incoming uncustomized base IC device parts from an incoming reel of tape media to the test sockets for custom programming,
control test socket custom programming of individual uncustomized base IC parts of the selected common type of compatible uncustomized base IC parts in different ways so as to produce the respective different types of custom IC device parts specified by the group of aggregated custom IC part orders, and
then control the handler to position the different types of custom IC device parts specified by the group of aggregated custom IC part orders into separate part compartments defined in the common carrier tape of the single outgoing reel of tape media.

7. A system configured to produce customized integrated circuit (IC) device parts from multiple incoming uncustomized base IC arts, comprising:

a test system comprising one or more test sockets, a handler, and an outgoing tape reel; and at least one processing device configured to communicate with the test system and programmed to control the handler to place each of multiple incoming uncustomized base IC device parts into the test sockets for custom programming to produce multiple custom programmed IC device parts, and then to remove and transfer the multiple custom programmed IC device parts into individual part compartments of a common carrier tape of the outgoing tape reel and cover the custom programmed IC device parts within the individual part compartments with a cover tape over the individual part compartments;

where the at least one processing device is further configured to communicate with the test system and programmed to:

control test socket custom programming of a common type of uncustomized base IC parts in different ways so as to produce respective different types of custom IC device parts specified by different custom IC part orders, and then control positioning the different types of custom IC device parts specified by the different custom IC part orders into separate part compartments defined in the common carrier tape of a single outgoing reel of tape media;

where the handler is configured to receive an incoming reel of tape media that contains a single mother lot of a selected common type of identical incoming uncustomized base IC device parts; and at least one processing device configured to communicate with the test system and programmed to:

analyze part customization information corresponding to multiple custom IC device part orders, each of the multiple custom IC device part orders specifying a type of custom IC device part that is different from the type of custom IC device parts specified by the other multiple custom IC device part orders, aggregate the multiple custom IC device part orders into at least a first and a second group of aggregated custom IC part orders, the first group of aggregated custom IC part orders specifying respective different types of custom IC device parts to be produced from a first selected common type of compatible uncustomized base IC parts and the second group of aggregated custom IC part orders specifying respective different types of custom IC device parts to be produced from a second selected common type of compatible uncustomized base IC parts that is different from the first selected common type of compatible uncustomized base IC parts, control the handler to transfer each of the first selected common type of compatible uncustomized base IC parts from a first incoming reel of tape media to the test sockets for custom programming, control test socket programming of individual uncustomized base IC parts of the first selected common type of compatible uncustomized base IC parts in different ways so as to produce the respective different types of custom IC device parts specified by the first group of aggregated custom IC part orders, and then control the handler to position the different types of custom IC device parts specified by the first group of aggregated custom IC part orders into part compartments defined in the tape of a first single outgoing reel of tape media, control the handler to transfer each of the second selected common type of compatible uncustomized base IC parts from a second incoming reel of tape media to the test sockets for custom programming, and control test socket programming of individual uncustomized base IC parts of the second selected common type of compatible uncustomized base IC parts in different ways so as to produce the respective different types of custom IC device parts specified by the second group of aggregated custom IC part orders, and control the handler to position the different types of custom IC device parts specified by the second group of aggregated custom IC part orders into part compartments defined in the tape of a second single outgoing reel of tape media that is different from the first single outgoing reel of tape media.

8. A method of producing customized integrated circuit (IC) device parts from uncustomized base IC parts, comprising:

using at least one processing device to custom program a common type of uncustomized base IC parts in different ways so as to produce respective different types of custom IC device parts specified by different custom IC part orders, the produced different types of custom IC device parts including a first type of custom IC device parts programmed from the common type of uncustomized base IC parts according to the specifications of a first custom IC part order, and a second type of custom IC device parts differently programmed than the first type of custom IC device parts from the same common type of uncustomized base IC parts according to the different specifications of a second custom IC part order; and then positioning the first and second types of custom IC device parts specified by the respective first and second custom IC part orders into separate part compartments defined in a common carrier tape of a single reel of tape media that includes a tape reel configured to receive the common carrier tape wound on the single reel.

9. The method of claim 8, further comprising:

then using at least one processing device to control positioning of the first type of custom IC device parts specified by the first custom IC part order as a first lot of multiple custom IC part devices inserted into adjacent separate part compartments defined in the common carrier tape of a single outgoing reel of tape media, and to control positioning of the second type of custom IC device parts specified by the second custom IC part order as a second lot of multiple custom IC part devices inserted into adjacent separate part compartments defined in the common carrier tape of a single outgoing reel of tape media.

10. The method of claim 9, further comprising using at least one processing device to control placement of first unique custom part identifier information on the common carrier tape or cover tape adjacent the separate part compartments containing the first lot of multiple custom IC part devices specified by the first custom IC part order; and placing second unique custom part identifier information on the common carrier tape or cover tape adjacent the separate part compartments containing the second lot of multiple custom IC part devices specified by the second custom IC part order; where the first unique custom part identifier information identifies the first custom IC part order and where the second unique custom part identifier information identifies the second custom IC part order.

11. The method of claim 10, further comprising:
reading the first unique custom part identifier information on the common carrier tape or cover tape to associate the first lot of multiple custom IC part devices with the first custom part IC part order, removing the first lot of multiple custom IC part devices from the part compartments defined in the tape of a single reel of tape media, and transporting the first lot of removed multiple custom IC part devices to a first end destination specified by the first custom part IC part order; and
reading the second unique custom part identifier information on the common carrier tape or cover tape to associate the second lot of multiple custom IC part devices with the second custom part IC part order, removing the second lot of multiple custom IC part devices from the part compartments defined in the tape of a single reel of tape media, and transporting the second lot of removed multiple custom IC part devices to a second end destination specified by the second custom part IC part order that is different than the first end destination.

12. The method of claim 9, further comprising using at least one processing device to:
control positioning of the first type of custom IC device parts specified by the first custom IC part order as a first lot of multiple custom IC part devices inserted into a first group of adjacent separate part compartments defined in the common carrier tape of a single reel of tape media; and
control positioning of the second type of custom IC device parts specified by the second custom IC part order as a second lot of multiple custom IC part devices inserted into a second group of adjacent separate part compartments defined in the common carrier tape of a single reel of tape media such that one or more empty part compartments are left between the first lot of multiple custom IC part devices inserted into a first group of adjacent separate part compartments and the second lot of multiple custom IC part devices inserted into a second group of adjacent separate part compartments.

13. The method of claim 12, further comprising:
using at least one processing device to control placement of a cover tape over the first and second lots of multiple custom IC part devices inserted into separate part compartments defined in the common carrier tape of a single reel of tape media;
using at least one processing device to control placement of first unique custom part identifier information on the cover tape over the one or more empty part compartments left between the first lot of multiple custom IC part devices and the second lot of multiple custom IC part devices, the first unique custom part identifier information identifying the first custom IC part order;
then severing the common carrier tape at or adjacent to the one or more empty part compartments left between the first lot of multiple custom IC part devices and the second lot of multiple custom IC part devices;
reading the first unique custom part identifier information on the common carrier tape or cover tape to associate the first lot of multiple custom IC part devices with the first custom part IC part order; and
removing the first lot of multiple custom IC part devices from the part compartments defined in the tape of a single reel of tape media, and transporting the first lot of removed multiple custom IC part devices to a first end destination specified by the first custom part IC part order.

14. The method of claim 8, where the uncustomized base IC parts are a group of multiple identical IC device parts diced from the same device wafer.

15. A reel of tape media comprising:
an elongated tape wound on a tape reel, the elongated tape comprising multiple separate part compartments defined therein that are configured to contain integrated circuit (IC) device parts; and
different types of custom IC device parts positioned in the separate part compartments defined in the same elongated tape wound on the tape reel, the different types of custom IC device parts comprising the first and second types of custom IC device parts produced by the method of claim 8.

16. The reel of claim 15, where the first type of custom IC device parts comprise a first lot of multiple custom IC part devices inserted into adjacent separate part compartments defined in the elongated tape wound on the tape reel; and where the second type of custom IC device parts comprise a second lot of multiple custom IC part devices inserted into adjacent separate part compartments defined in the elongated tape wound on the tape reel.

17. The reel of claim 16, further comprising first unique custom part identifier information placed on the elongated tape adjacent the separate part compartments containing the first lot of multiple custom IC part devices specified by the first custom IC part order; and second unique custom part identifier information placed on the elongated tape adjacent the separate part compartments containing the second lot of multiple custom IC part devices specified by the second custom IC part order; where the first unique custom part identifier information identifies the first custom IC part order and where the second unique custom part identifier information identifies the second custom IC part order.

18. The reel of claim 17, where the first type of custom IC device parts specified by the first custom IC part order are positioned as a first lot of multiple custom IC part devices within a first group of adjacent separate part compartments defined in the common carrier tape of a single reel of tape media; and where the second type of custom IC device parts specified by the second custom IC part order are positioned as a second lot of multiple custom IC part devices within a second group of adjacent separate part compartments defined in the common carrier tape of the single reel of tape media such that one or more empty part compartments are left between the first lot of multiple custom IC part devices inserted into the first group of adjacent separate part compartments and the second lot of multiple custom IC part devices inserted into the second group of adjacent separate part compartments.

19. The reel of claim 18 further comprising a cover tape placed over the first and second lots of multiple custom IC part devices inserted into separate part compartments defined in the common carrier tape of a single reel of tape media; and where the first unique custom part identifier information is present on the cover tape over the one or more empty part compartments left between the first lot of multiple custom IC part devices and the second lot of multiple custom IC part devices, the first unique custom part identifier information identifying the first custom IC part order.

20. A method of producing customized integrated circuit (IC) device parts from uncustomized base IC parts, comprising:

using at least one processing device to custom program a common type of uncustomized base IC parts in different ways so as to produce respective different types of custom IC device parts specified by different custom IC part orders; and then positioning the different types of custom IC device parts specified by the different custom IC part orders into separate part compartments defined in a common carrier tape of a single reel of tape media;

where the method further comprises:

using at least one processing device to analyze part customization information corresponding to multiple custom IC device part orders, each of the multiple custom IC device part orders specifying a type of custom IC device part that is different from the type of custom IC device parts specified by the other multiple custom IC device part orders, using at least one processing device to aggregate the multiple custom IC device part orders into at least one group of aggregated custom IC part orders specifying respective different types of custom IC device parts to be produced from a selected common type of compatible uncustomized base IC parts, producing the different types of custom IC device parts of the group of aggregated custom IC part orders by custom programming individual uncustomized base IC parts of the selected common type of compatible uncustomized base IC parts in different ways so as to produce the respective different types of custom IC device parts specified by the group of aggregated custom IC part orders, and positioning the different types of custom IC device parts specified by the group of aggregated custom IC part orders into part compartments defined in the tape of a single reel of tape media.

21. A method of producing customized integrated circuit (IC) device parts from uncustomized base IC parts, comprising:

using at least one processing device to custom program a common type of uncustomized base IC parts in different ways so as to produce respective different types of custom IC device parts specified by different custom IC part orders; and then positioning the different types of custom IC device parts specified by the different custom IC part orders into separate part compartments defined in a common carrier tape of a single reel of tape media;

where the method further comprises:

using at least one processing device to analyze part customization information corresponding to multiple custom IC device part orders, each of the multiple custom IC device part orders specifying a type of custom IC device part that is different from the type of custom IC device parts specified by the other multiple custom IC device part orders, using at least one processing device to aggregate the multiple custom IC device part orders into at least a first and a second group of aggregated custom IC part orders, the first group of aggregated custom IC part orders specifying respective different types of custom IC device parts to be produced from a first selected common type of compatible uncustomized base IC parts and the second group of aggregated custom IC part orders specifying respective different types of custom IC device parts to be produced from a second selected common type of compatible uncustomized base IC parts that is different from the first selected common type of compatible uncustomized base IC parts, producing the different types of custom IC device parts of the first group of aggregated custom IC part orders by custom programming individual uncustomized base IC parts of the first selected common type of compatible uncustomized base IC parts in different ways so as to produce the respective different types of custom IC device parts specified by the first group of aggregated custom IC part orders, producing the different types of custom IC device parts of the second group of aggregated custom IC part orders by custom programming individual uncustomized base IC parts of the second selected common type of compatible uncustomized base IC parts in different ways so as to produce the respective different types of custom IC device parts specified by the second group of aggregated custom IC part orders, positioning the different types of custom IC device parts specified by the first group of aggregated custom IC part orders into part compartments defined in the tape of a first single reel of tape media, and positioning the different types of custom IC device parts specified by the second group of aggregated custom IC part orders into part compartments defined in the tape of a second single reel of tape media that is different from the first single reel of tape media.

* * * * *